United States Patent
Florian et al.

(10) Patent No.: US 9,153,765 B2
(45) Date of Patent: Oct. 6, 2015

(54) PIEZOELECTRIC MULTILAYER COMPONENT

(75) Inventors: Heinz Florian, Bad Gams (AT); Michael Hirschler, Graz (AT); Helmut Sommariva, Graz (AT)

(73) Assignee: EPCOS AG, Munich (DE)

( * ) Notice: Subject to any disclaimer, the term of this patent is extended or adjusted under 35 U.S.C. 154(b) by 1591 days.

(21) Appl. No.: 11/916,725

(22) PCT Filed: Jun. 9, 2006

(86) PCT No.: PCT/DE2006/000992
§ 371 (c)(1),
(2), (4) Date: Nov. 10, 2008

(87) PCT Pub. No.: WO2006/131106
PCT Pub. Date: Dec. 14, 2006

(65) Prior Publication Data
US 2009/0278422 A1    Nov. 12, 2009

(30) Foreign Application Priority Data
Jun. 9, 2005   (DE) .......................... 10 2005 026 717

(51) Int. Cl.
*H01L 41/083*    (2006.01)
(52) U.S. Cl.
CPC .................................. *H01L 41/0838* (2013.01)
(58) Field of Classification Search
CPC ............. H01L 41/083; H01L 41/0831; H01L 41/0833; H01L 41/0838
USPC .......................................... 310/328, 365, 366
See application file for complete search history.

(56) References Cited

U.S. PATENT DOCUMENTS

| 4,932,119 A * | 6/1990 | Ealey et al. ...................... 29/593 |
| 2006/0238073 A1 | 10/2006 | Ragossnig et al. |
| 2009/0289527 A1 | 11/2009 | Hirschler et al. |

FOREIGN PATENT DOCUMENTS

| DE | 197 09 690 | 9/1998 |
| DE | 102 34 659 | 2/2004 |
| DE | 103 07 825 | 9/2004 |
| DE | 102004012282 | 10/2004 |
| GB | 2 375 884 | 11/2002 |
| JP | 5-206534 | 8/1993 |
| JP | 8-195512 | 7/1996 |
| JP | 2002-353529 | * 12/2002 ............ H01L 41/083 |
| JP | 2007-12867 | 1/2007 |
| WO | WO98/05080 | 2/1998 |
| WO | WO2004/077583 | 9/2004 |
| WO | WO2006/042791 | 4/2006 |
| WO | WO2006/079324 | 8/2006 |
| WO | WO2007/104301 | 9/2007 |

OTHER PUBLICATIONS

Machine Translation of JP 2002-353529.*

(Continued)

*Primary Examiner* — Derek Rosenau
(74) *Attorney, Agent, or Firm* — Fish & Richardson P.C.

(57) ABSTRACT

The invention relates to a piezoelectric multi-layer component with a plurality of piezoelectric layers (1) lying one above the other and with electrode layers (2a, 2b) arranged between the piezoelectric layers, wherein an absorption layer (4) of absorbing mechanical vibration energy is arranged in the layer stack.

27 Claims, 2 Drawing Sheets

(56) References Cited

OTHER PUBLICATIONS

Translation of JP2007-12867, dated Mar. 2, 2010.
English Translation of the International Preliminary Report on Patentability (including Written Opinion) in Application No. PCT/DE2006/000992, dated Jan. 16, 2008.
International Search Report in Application No. PCT/DE2006/000992, dated Nov. 14, 2006.
Search Report from corresponding PCT Application No. PCT/EP2006/000992.
English translation of Written Opinion of PCT/EP2006/000992.
European Search Report in Application No. 10176613.7, dated Jan. 12, 2011.
English Translation of the Notification of Reasons for Refusal in Japanese Application No. 2008-515041, dated Feb. 10, 2012.
Machine Translation of JP5-206534, published Aug. 1993.
English Translation of the Notification of Reasons for Refusal in Japanese Application No. 2008-515041, dated Jan. 25, 2013.
Machine Translation of Japanese Publication No. 8-195512 (Pub. Date Jul. 1996).

* cited by examiner

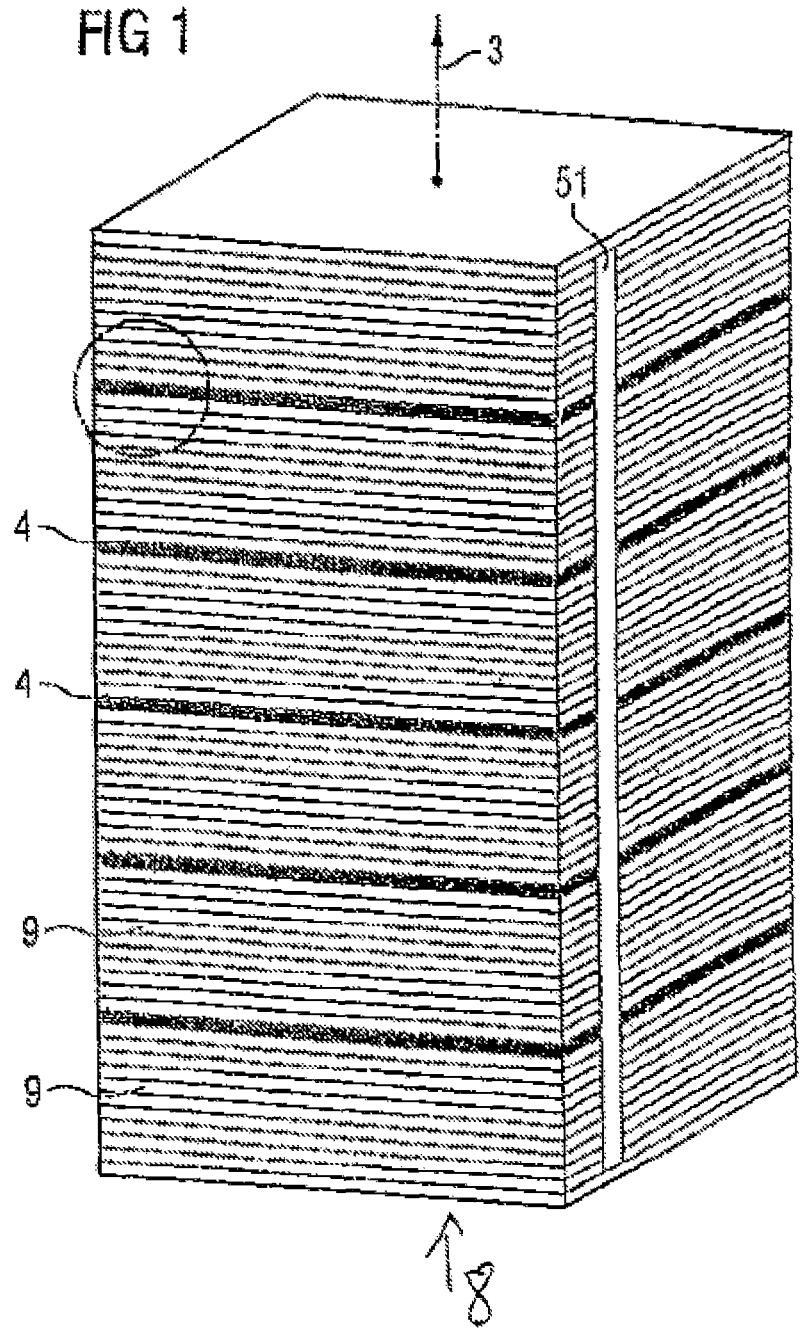

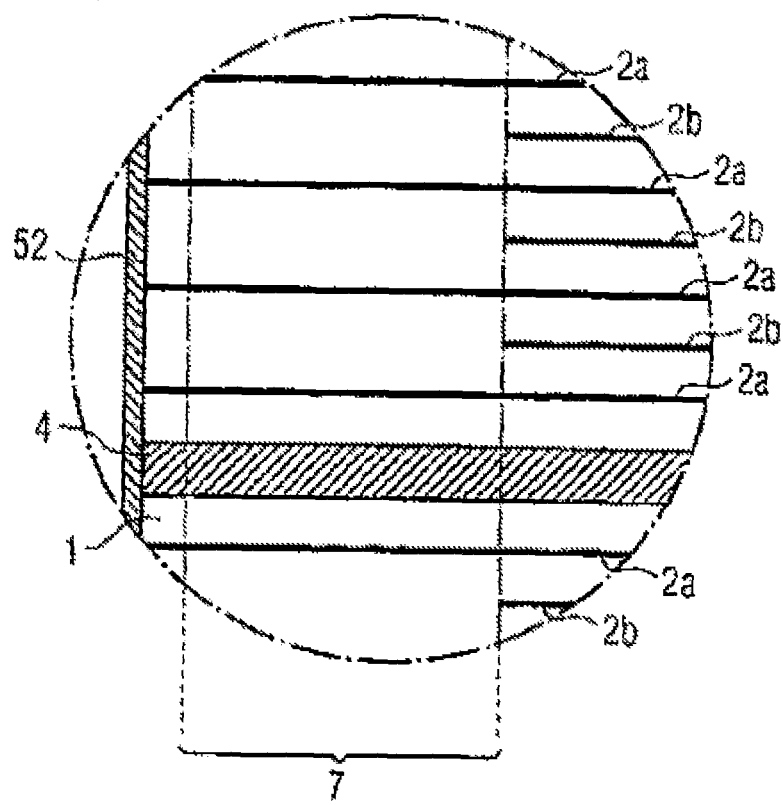

PIEZOELECTRIC MULTILAYER COMPONENT

TECHNICAL FIELD

A piezoelectric multi-layer component is described herein, which includes ceramic layers in a stack and electrode layers among the ceramic layers.

BACKGROUND

DE 103 07 825 A1 describes piezoactuators in which piezoceramic layers are arranged one above the other in a stack.

SUMMARY

Described herein is a piezoelectric multi-layer component, which is suitable for use in a motor vehicle.

In an embodiment, the piezoelectric multi-layer component includes a stack of layers. The stack of layers includes piezoelectric layers, electrode layers, and an absorption layer to produce an interface effect for a pressure wave or a vibration pulse that affects the piezoelectric multi-layer component. The stack of layers may also include additional absorption layers.

The electrode layers, which function as internal electrodes and which are used for establishing an electric field in the piezoelectric layers, can be arranged among the piezoelectric layers. An electrode layer may be arranged between every two piezoelectric layers.

In an embodiment of the component, the absorption layer is capable of absorbing mechanical vibrations.

The interface effect referred to herein relates to the behavior of a wave when it passes from a medium of first density into a medium of second density. Its properties are changed, e.g., its shape and/or its type of propagation. The changing of wave properties can include a change in amplitude, deflection, distortion, or refraction.

The interface effect can be produced both within the absorption layer and also at the interface between absorption layers and adjacent electrode layers or piezoelectric layers.

Mechanical vibrations appear in the described piezoelectric component, for example, when the component is used in a fuel-injection system of a motor vehicle. In this case, mechanical forces act on the piezoelectric multi-layer component according to the construction of the injection system. The mechanical loading can be produced, for example, from a force-path diagram under consideration of the dynamics of the injection process. If the expansion of the piezoelectric multi-layer component is limited by a mechanical stop, as is the case, for example, in pump-nozzle injection systems for diesel engines, then especially high mechanical loads appear, against which the piezoelectric multi-layer component must be protected, because there is the risk of damage. Similarly, the dynamic reactions of the injection system, when quickly moving mechanical parts impact the piezoelectric multi-layer component, for example, can generate mechanical vibrations or mechanical loads on the component.

The use of a component with an absorption layer has the advantage that at least one part of the mechanical vibration energy, for example, the impact energy or the shock energy, can be absorbed by the absorption layer so that the risk of mechanical damage to the multi-layer component is reduced.

The absorption layer may be shaped so that there is the possibility of dissipation, i.e., the vibration energy or the mechanical energy can be converted into heat.

The interface effect in or at the absorption layers can lead to the absorption, refraction, dispersion, or also deflection of the mechanical energy. The mechanical energy can originate from a pressure wave or from a mechanical vibration pulse and can have been generated by impact, shock, sound, or vibration energy.

In an embodiment, all mechanical energy introduced into the component through impact or vibration is dispersed, deflected, or damped at one of the absorption layers. The absorption layer can be designed as an area with changed density and thus elasticity or compressibility in the component. This area should deflect pressure or sound waves and absorb vibration energy.

For the operation of the multi-layer component described here, generation of a crack in the absorption layers is not intended. If a crack does appear, then this is a crack that has the longest possible length and runs completely in the absorption layer, in order to absorb a great amount of energy. The crack may be a zigzag curve with as many changes in direction as possible relative to the extent of the crack and with the greatest possible overall length with reference to the radial extent of the layer stack. Here it does not involve a smooth crack in the absorption layers.

In addition, the absorption layer has the advantage that, for a rapid sequence of several mechanical impacts on the multi-layer component, long-term propagation of the resulting mechanical shock waves, for example, also due to reflection at the outer ends of the component, can be effectively prevented. For this purpose, the absorption layer is shaped so that, for example, shock waves running through the component at the speed of sound undergo diffraction or refraction at interfaces between an absorption layer and a piezoelectric layer or at an interface between an absorption layer and an internal electrode layer, wherein the straight-line propagation of the shock waves is attenuated. Therefore, large amplitude oscillation or cumulative shock wave packets caused by mechanical impacts in rapid succession can be reduced in terms of their intensity and the risk of damage to the component can be reduced.

The absorption layer can be a ceramic, for example, a piezoelectric layer.

The absorption layer may have a different, e.g., lower, density than the adjacent piezoelectric layers. The absorption layer can also contain compressible areas, which may be made from solid or also gaseous materials.

When the absorption layer is produced on the basis of a ceramic material, it is advantageous when it is thicker or even significantly thicker than the piezoelectric layers. For example, the absorption layer can be two to three times thicker than the other piezoelectric layers. Therefore, the elasticity of the entire component can be increased and the sensitivity relative to impact can be reduced accordingly.

The absorption layer can also be formed from the ground up from an elastic material, e.g., an adhesive. In this case, an absorption layer that is thin compared with the piezoelectric layers is sufficient for increasing the overall elasticity of the entire stack.

The absorption layer may have a higher elasticity than its surroundings and than the piezoelectric layers.

The compressibility of the absorption layer may be higher than other layers of the layer stack. Consequently, the component can have reduced stiffness.

The absorption layers may contain a substance that differs from the base material of the piezoelectric layers.

In an embodiment of the component, an absorption layer is a ceramic layer. The piezoelectric layers of the layer stack may also be ceramic layers. In this case, it is advantageous when the reduced density of the absorption layer is obtained through a higher porosity than that of the adjacent piezoelectric ceramic layers.

According to another embodiment of the component, the component is produced through common sintering of several ceramic green films lying one above the other. Through such a sintering process, for example, a monolithic component can be produced.

In addition, in an embodiment of the component, several absorption layers are arranged distributed through the layer stack. For the case that a ceramic material is used as the absorption layer, the absorption layer can be sintered together with the other piezoelectric ceramic layers. Therefore, a good mechanical connection of the absorption layer to the rest of the component is produced, so that the mechanical load on the component is improved.

For the component described here, at least one absorption layer can be provided, which contains an inorganic substance. This inorganic substance provides the layer with compressibility. This substance can cause boundary effects for pressure waves due to its distribution, wherein these effects dissipate and refract the pressure waves. For example, the inorganic substance can be a gas. However, a correspondingly distributed crystalline or amorphous solid body can also be considered. The distribution of the inorganic substance can be in the form of particles, which are uniformly distributed over the thickness and the lateral extent of the layer.

In an embodiment of the component, an absorption layer is provided, which contains an inorganic material. For example, it can involve a metal or also a ceramic substance.

In addition, in an embodiment of the component, the absorption layer contains organic materials or is even completely constructed from organic materials. For this purpose, for example, adhesives or also duroplastics can be used.

The organic components are selected, in particular, so that they receive vibration energy according to their material properties and corresponding to their distribution in the absorption layer and refract or dissipate pressure waves. The distribution of the organic components may be similar to that of the inorganic components.

In an embodiment of the component, the absorption capacity of the absorption layer is achieved through a higher porosity relative to the ceramic layers.

The component may be produced though sintering a stack of ceramic green films lying one above another with electrode layers among the piezoelectric layers, including between adjacent piezoelectric layers. In this way, a monolithic component is realized, which can be produced easily and inexpensively and which has sufficient mechanical stability for the other processing steps.

To further improve the absorption capacity of the component in terms of mechanical vibrations, absorption layers are provided at several positions along the longitudinal axis. In this way, to a certain extent, the component is divided along the longitudinal axis into several sub-components.

Porous layers in a ceramic multi-layer component represent a discontinuity for pressure waves. Furthermore, fluids or gases can penetrate from the outside into the component at the pores. Therefore, it is advantageous to keep the porous layers essentially free from electric fields during the operation of the component, in order to prevent undesired migration effects. This is achieved by making two electrode layers directly adjacent to an absorption layer the same electric potential. Then, significant electric fields can no longer be formed via the absorption layer.

In one embodiment of the component, the porosity of the absorption layer is increased relative to the ceramic layers by a factor between 1.2 and 3. This information on porosity relates to the following methods for measuring porosity:

The component is viewed in a ground section of a specimen. Pores that could appear both in the ceramic layers and also in the absorption layers differ through a color or light-dark contrast from the surrounding ceramic material. Now, for each type of layer, that is, for the ceramic layer and for an absorption layer, the surface area portion of the pores per unit surface area is determined by this unit surface area. The quotient from the two surface area portions of the pores gives the factor of the increased porosity.

The porosity can also be given as a fraction of the theoretically possible density. In this case, the ceramic layers would have a density of 97-98% of the theoretical density and the absorption layers would have a density of 90-95% of the theoretical density.

In addition, it is advantageous when the absorption layer is made from the same ceramic material as the piezoelectric ceramic layers. Therefore, the plurality of materials for the component can be reduced, which also has the positive secondary effect that the additional processes for producing the component, for example, debinding and sintering, can be performed more easily.

It is also advantageous when the electric multi-layer component is a piezoelectric actuator, which can be used in motor vehicles.

The layer stack described herein has the advantage that through an increased volume portion of binding agent in one or more of the green films in the layer stack, the production of ceramic layers with increased porosity is possible. The binding agent is removed, i.e., before sintering through a decarburization process, whereby pores can then be formed at the positions in the layers in which the high portion of binding agent was present.

It is advantageous when the volume portion of binding agent is increased by a factor between 1.5 and 3. Therefore, the risk of there being too little ceramic powder in the ceramic layer can be reduced, so that after the sintering, not a monolithic component, but instead a component divided into individual sub-components is already produced before the electrical operation.

With the aid of the measures described here, an absorption layer can be prepared, which has greater elasticity than the adjacent layers, by means of which the absorption of pressure waves can be improved. In addition, through the arrangement of the absorption layers in the multi-layer component, the compressibility of the component is improved and thus the stiffness is reduced.

Below, a component is explained in more detail with reference to an embodiment and the associated figures.

DESCRIPTION OF THE DRAWINGS

FIG. 1 shows, as an example, a multi-layer component in a perspective view.

FIG. 2 shows a longitudinal section of a partial area of the component from FIG. 1.

DETAILED DESCRIPTION

FIGS. 1 and 2 show a piezoelectric actuator, in which a plurality of ceramic layers 1 is stacked along a longitudinal axis 3 one above the other. In particular, a PZT ceramic, for example, the compound $Pb_{0.96}Cu_{0.02}Nd_{0.02}(Zr_{0.54}Ti_{0.46})O_3$ can be used as the ceramic material for the ceramic layers 1.

In addition, electrode layers 2a, 2b are provided, which are each arranged between two adjacent ceramic layers 1. Here, the electrode layers 2a are at one electrical potential of the component, and the electrode layers 2b are at another electrical potential of the electric component. The electrode layers 2b guided completely up to the right edge of the component are electrically conductively connected to each other through the external contacts 51 and simultaneously the external contacts 51 allow the application of an electric voltage source.

Accordingly, the electrode layers 2b on the left side of the component reaching up to the outer edge are electrically conductively connected to an external contact 52 arranged on the left of the component (now visible in FIG. 1). The other potential of the electrical voltage source can be connected to the external contacts 52.

In the region of a passive zone 7, the electrode layers 2a and 2b do not overlap each other, but instead there are only electrode layers of a single type, for example, electrode layers 2a (cf. FIG. 2) in the passive zone 7. In order to attenuate a shock 8 coming from the outside in terms of its destructive effect on the component, absorption layers 4 are provided.

In order to keep the absorption layer 4 as free from fields as possible even during the operation of the piezoactuator, it is provided, as shown in FIG. 2, to assign the electrode layers 2a directly adjacent to the absorption layer 4 to the same electric potential of the piezoactuator.

The distribution of the absorption layers 4 along the longitudinal axis 3 is such that sub-actuators 9 are produced, whose height is so greatly reduced that the mechanical vibrations occurring during the normal operation of the piezoactuator can no longer generate destructive effects in the actuator.

For example, a 30-mm high piezoactuator can be divided by nine absorption layers 4 into ten sub-actuators 9, where each sub-actuator 9 has a height of 3 mm. This height of 3 min corresponds in one embodiment of the actuator to 37 ceramic layers 1.

In the case of essentially ceramic absorption layers, these can have a thickness between 120 to 300-μm for 120 μm thick piezoelectric layers.

In the case of essentially elastic absorption layers, e.g., for absorption layers made from plastic or adhesive, a thickness of only a few μm is sufficient.

For example, a mixture of silver and palladium, like that which is suitable for common sintering with piezoactive ceramic layers, can be used as the material for the electrode layers 2a, 2b. In addition, however, electrode layers 2a, 2b can also be used, which contain copper or are even made completely from copper.

The production of the piezoactuator shown in FIGS. 1 and 2 can be realized by a layer stack, whose appearance is essentially the same as the component shown in FIGS. 1 and 2, except that no external contacts 51, 52 are provided. The construction of the ceramic layers, the electrode layers, and the absorption layer corresponds to the construction of a layer stack, where the ceramic layers are constructed in a blank mold as ceramic green films containing a ceramic powder and an organic binder. The electrode layers are constructed as metal powder-containing paste. The absorption layers are constructed, like the ceramic layers, as green films, except that the portion of organic binder in the layers to be subsequently processed into the absorption layers is increased relative to the other ceramic layers. For example, green films can be used for the ceramic layers, where the organic binder occupies a volume portion of 30%. To increase the volume portion in certain layers of the layer stack, this can be increased to a volume portion of 50 to 60%. With such a volume portion of organic binders, the problems of the accumulation of the ceramic powder and of the inability to draw defined films can be avoided.

The component is produced through common sintering of the layers located in the layer stack. This may occur in a single processing step.

It is noted that the previously described electrical multi-film component is not limited to the named ceramic material. Instead, all possible ceramic materials that exhibit a piezoelectric effect can be used. In addition, the component is also not limited to piezoactuators. Instead, all possible ceramic materials that exert an electrical function can be used. In particular, the component can always be used where it is exposed to mechanical loads, such as shock loads.

The invention claimed is:

1. A piezoelectric multi-layer component comprising a stack of layers, the stack of layers comprising:
   piezoelectric layers;
   electrode layers, the electrode layers being among the piezoelectric layers; and
   an absorption layer to produce an interface effect for a pressure wave or a vibration pulse that affects the piezoelectric multi-layer component, the absorption layer being among piezoelectric and electrode layers in the stack;
   wherein the piezoelectric layers, the electrode layers, and the absorption layer together form a sintered monolithic component; and
   wherein the absorption layer is thicker than individual piezoelectric layers.

2. The piezoelectric multi-layer component of claim 1, wherein the absorption layer is configured to produce at least one of the following effects on the vibration pulse or on the pressure wave: absorption, refraction, destruction, and deflection.

3. The piezoelectric multi-layer component of claim 1, wherein the pressure wave or the vibration pulse is generated via impact, shock, sound, or vibration energy.

4. The piezoelectric multi-layer component of claim 1, wherein the absorption layer comprises a ceramic layer.

5. The piezoelectric multi-layer component of claim 1, wherein the absorption layer comprises a piezoelectric layer.

6. The piezoelectric multi-layer component of claim 1, wherein the absorption layer has a lower density than ones of the piezoelectric layers in the stack that are adjacent to the absorption layer.

7. The piezoelectric multi-layer component of claim 1, wherein the absorption layer comprises compressible regions comprised of solid or gaseous components.

8. The piezoelectric multi-layer component of claim 1, wherein the absorption layer has a higher porosity than ones of the piezoelectric layers in the stack that are adjacent to the absorption layer.

9. The piezoelectric multi-layer component of claim 1, wherein piezoelectric layers in the stack are sintered with each other.

10. The piezoelectric multi-layer component of claim 1, wherein the stack comprises additional absorption layers.

11. The piezoelectric multi-layer component of claim 10, wherein absorption layers in the stack are uniformly distributed over a height of the stack.

12. The piezoelectric multi-layer component of claim 1, wherein the absorption layer comprises an inorganic material and piezoelectric ceramic.

13. The piezoelectric multi-layer component of claim 1, wherein the absorption layer comprises an inorganic material that makes the absorption layer compressible and that causes an interface effect for a pressure wave as a result of distribution of the inorganic material.

14. The piezoelectric multi-layer component of claim 1, wherein the absorption layer comprises an inorganic material, the inorganic material comprising: a gas, a distributed crystalline, or an amorphous solid body.

15. The piezoelectric multi-layer of claim 1, wherein the absorption layer comprises a metal or a ceramic.

16. The piezoelectric multi-layer component of claim 1, wherein the absorption layer comprises an inorganic substance.

17. The piezoelectric multi-layer component of claim 1, wherein the absorption layer comprises an adhesive or a duroplastic.

18. The piezoelectric multi-layer of claim 1, wherein electrode layers adjacent to the absorption layer are at a same electric potential.

19. The piezoelectric multi-layer component of claim 1, wherein a porosity of the absorption layer is 1.2 to 3 times a porosity of the piezoelectric layers in the stack.

20. The piezoelectric multi-layer component of claim 1, wherein the absorption layer comprises a same ceramic substance as the piezoelectric layers in the stack.

21. The piezoelectric multi-layer component of claim 10, wherein absorption layers in the stack have higher elasticity than ones of the piezoelectric layers in the stack that are adjacent to the absorption layers.

22. The piezoelectric multi-layer component of claim 10, wherein absorption layers in the stack have higher compressibility relative to ones of the piezoelectric layers in the stack that are adjacent to the absorption layers.

23. The piezoelectric multi-layer component of claim 10, wherein absorption layers in the stack are configured to reduce stiffness in the piezoelectric multi-layer component.

24. The piezoelectric multi-layer component of claim 10, wherein absorption layers in the stack are configured so as not to crack during operation of the piezoelectric multi-layer component.

25. The piezoelectric multi-layer component of claim 1, which is configured so that, during operation of the piezoelectric multi-layer component, a crack produced in the absorption layer has a traced length that is longer than a length of the absorption layer.

26. The piezoelectric multi-layer component of claim 10, wherein the absorption layers comprise a material that is different from a base substance of the piezoelectric layers.

27. A method for use with a piezoelectric multi-layer component comprising a stack of layers, the stack of layers comprising piezoelectric layers, electrode layers, and absorption layers, the method comprising:
  using the absorption layers to absorb mechanical energy in the piezoelectric multi-layer component through scattering, deflection, or damping;
  wherein the electrode layers are among the piezoelectric layers;
  wherein the absorption layers are among piezoelectric and electrode layers in the stack;
  wherein the piezoelectric layers, the electrode layers, and the absorption layers together form a sintered monolithic component; and
  wherein an absorption layer is thicker than individual piezoelectric layers.

* * * * *

UNITED STATES PATENT AND TRADEMARK OFFICE
CERTIFICATE OF CORRECTION

PATENT NO. : 9,153,765 B2
APPLICATION NO. : 11/916725
DATED : October 6, 2015
INVENTOR(S) : Heinz Florian et al.

Page 1 of 1

It is certified that error appears in the above-identified patent and that said Letters Patent is hereby corrected as shown below:

Title Page, Title:
Delete "MULTILAYER" and Insert --MULTI-LAYER--

IN THE SPECIFICATION

Column 1, Title:
Delete "MULTILAYER" and insert --MULTI-LAYER--

IN THE CLAIMS

Column 7, Claim 15, Line 8 (approx):
Insert --component-- after "multi-layer"

Column 7, Claim 18, Line 16 (approx):
Insert --component-- after "multi-layer"

Signed and Sealed this
First Day of March, 2016

Michelle K. Lee
*Director of the United States Patent and Trademark Office*